United States Patent [19]

Williams et al.

[11] Patent Number: 4,827,610
[45] Date of Patent: May 9, 1989

[54] METHOD OF CREATING SOLDER OR BRAZING BARRIERS

[75] Inventors: Ralph E. Williams, Richardson; David B. Rhine, Denton; John Bedinger, Garland; Larry G. Barnett, Wylie, all of Tex.

[73] Assignee: Texas Instruments Incorporated, Dallas, Tex.

[21] Appl. No.: 91,807

[22] Filed: Aug. 31, 1987

[51] Int. Cl.$^4$ ............................ H05K 3/00; H05K 3/42
[52] U.S. Cl. ............................ 29/840; 29/829; 228/118; 427/96
[58] Field of Search ............ 29/829, 832, 840; 228/118; 427/96, 97

[56] References Cited

U.S. PATENT DOCUMENTS 4,360,968 11/1982 D'Amico et al. ............ 29/840

4,544,577 10/1985 May ............................ 427/97

Primary Examiner—Timothy V. Eley
Assistant Examiner—Taylor J. Ross
Attorney, Agent, or Firm—Melvin Sharp; René E. Grossman; Ferdinand M. Romano

[57] ABSTRACT

A method of preparing a substrate such as a semiconductor chip or ceramic thin film having vias for soldering to a substrate requires that a first metal that is resistive to solder bonding be deposited on the backside of the semiconductor device. The deposited metal is removed from the surface of the semiconductor device, leaving the vias of the semiconductor device having the first metal deposited through them. This technique is useful in any requirement requiring a solder or brazing barrier. That is a photolithographic process in conjunction with a refractory or nonsolderable metal deposit is used to achieve an alloy or solder barrier.

16 Claims, 4 Drawing Sheets

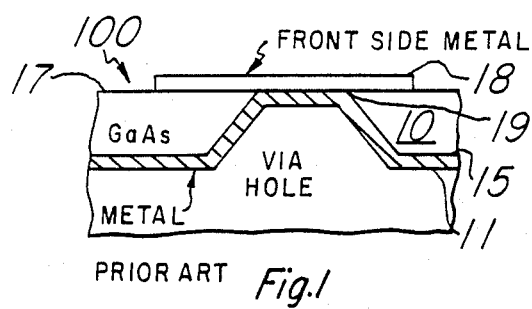
PRIOR ART Fig.1
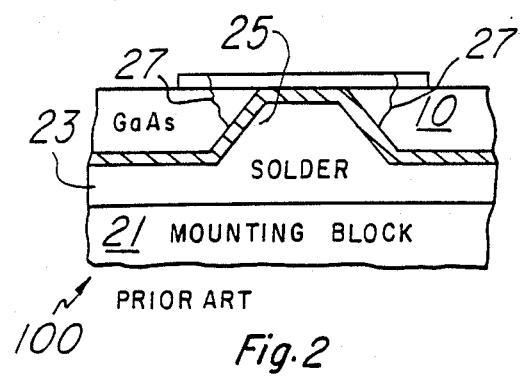
PRIOR ART Fig.2
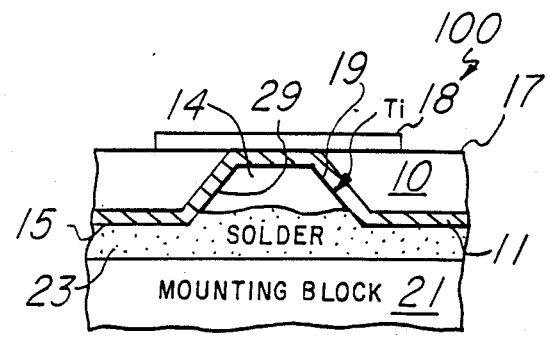
Fig.3

METHOD OF CREATING SOLDER OR BRAZING BARRIERS

BACKGROUND OF THE INVENTION

This invention relates to a to a method of providing solder or brazing barriers with a photolithographic process in conjunction with a refractory or nonsolderable metal deposit in order to achieve and alloy or solder barrier. It has a particular application to thin brittle wafers having vias such as a semiconductor chip or a substrate.

Semiconductor devices such as thin film network components, gallium arsenide MMICs (monolithic microwave integrated circuits) and discrete field effect transistors commonly employ vias (feed through holes in the device) which serve as conduits for connecting a backside ground plane to the front side circuit metalization.

FIG. 1 illustrates this arrangement in which a semiconductor chip 10, which in the embodiment of FIG. 1 is a gallium arsenide device, has a ground plane established by a metal deposit 11 that is deposited on the backside 15 of the semiconductor chip 10. A circuit configuration is provided on the front side 17 of the semiconductor chip 10 in the form of a metalization 18. The metalization 18 is connected to the ground plane 11 by a via 14 that serves as a conduit for connecting the ground plane 11 to the front side metalization 18 at point 19.

Referring to FIG., 2 the vias in the semiconductor chip 10 are essential to high performance MMICs. These MMICs in complex circuit arrangements are connected to additional circuits which may generate substantial heat when in operation. Therefore, for these complex circuits MMIC's are mounted to a substrate such as that illustrated in FIG. 2 and denoted as mounting block 21. This is very often required to achieve good thermal characteristics. However, when the semiconductor device 10 is mounted to the substrate 21 through the use of soldering, the solder 23 tends to be drawn up into the via 14 as indicated at 25 filling all or most of the via 14 as is shown in FIG. 2. The differential expansion between the solder and the brittle semiconductor chip 10 such as gallium arsenide or a ceramic thin film can cause the material near the via to crack, as is illustrated at 27. Such cracks can cause either immediate device failures or propagate under operating stress and produce future device failures. Altough such cracks do not always develop, experience with MMIC devices, as well as other semiconductor devices and ceramic thin films, illustrate this effect to be very serious in both yield and reliability.

SUMMARY OF THE INVENTION

A method of preparing a substrate such as a semiconductor chip or ceramic thin film having vias for soldering to a substrate requires that a first metal that is resistive to solder bonding be deposited on the backside of the semiconductor device. The deposited metal is removed from the surface of the semiconductor device, leaving the vias of the semiconductor device having the first metal deposited along them. This technique is useful in any requirement requiring a solder or brazing barrier. That is, a photolithographic process in conjunction with a refractory or nonsolderable metal depsoite is used to achieve an alloy or solder barrier.

The steps of removing the first metal from the semiconductor device while leaving it within the via include the steps of covering the first metal with a photosensitive material. After the photosensitive material has been placed over the first metal, it is exposed to light with a predetermined intensity for a predetermined period of time. The intensity and time are selected such that the resist reacts with the light that is over the semiconductor device. The reaction period is of insufficient duration to allow the light to react with all of the resist within the via.

The activated resist is removed from the first material after which the first material is stripped through a stripping process such as plasma reaction, leaving the first material within the via.

The materials found to be successful in this operation is titanium, titanium/tungsten, nichrome or aluminum, all of which have the characteristics of being readily oxidized when exposed to air and thus prevents the bonding of solder to their surfaces.

It is the object of the invention to provide a method of manufacturing semiconductor devices that may be soldered to other mounting blocks or substrates without fear of cracking due to solder filling the via holes.

It is yet another object of the invention to provide a method of manufacturing a semiconductor device having via holes that prevent the wicking of solder up through the via holes and thus prevent cracking. The disclosed method is easily performed without the expense of having to develop a precise mask for semiconductor device.

It is yet another object of the invention to provide a method of providing an alloy or solder barrier that is capable of being defined with a high resolution and is stable at high temperatures.

These and other objects and advantages of the invention will be more apparent from a reading of the specificatiin in conjunction with the figures in which:

BRIEF DESCRIPTION OF THE DRAWINGS

FIG. 1 is a prior art illustration of a semiconductor device that includes a via hole;

FIG. 2 shows a prior art illustration of the mounting a semiconductor device with via holes to a mounting block;

FIG. 3 is a diagram illustrating a semiconductor device having a via hole according to the invention that is mounted to a mounting block;

DETAILED DESCRIPTION OF THE EMBODIMENTS

Figure 4:
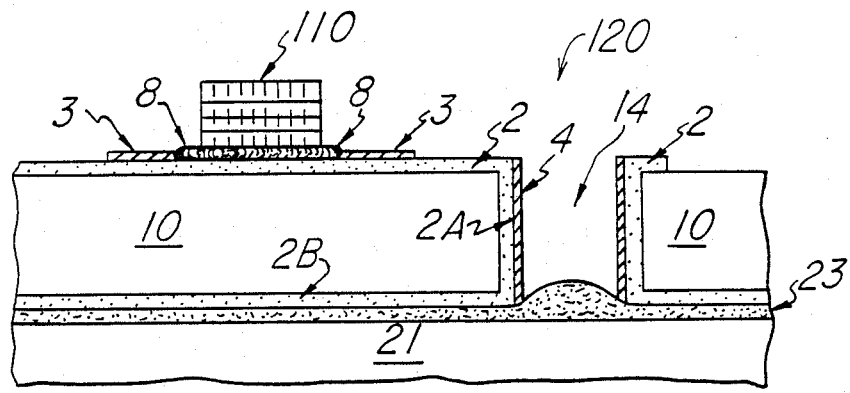
FIG. 4 is a diagram of a thin film ceramic substrate with plated via holes according to the invention.

In FIG. 3, to which reference should now be made, there is shown a semiconductor device 100 including a substrate 10 that is mounted to a second substrate or mounting block 21 and held in place by solder 23. The steps used in mounting the semiconductor device 10 to the mounting block 21 provide for placing a layer of solder 23 on the mounting block 21. The semiconductor device is then placed on the solder 23 and heated, according to standard semiconductor techniques such as placing the combination of the mounting block 21 and semiconductor device 100 in an oven, until the solder melts. When the solder melts it adheres to the conductor 11 but is prevented from wicking within a via hole 14 because the via hole is coated with a material 19. The material 19 in the embodiment of FIG. 3 and FIG. 4 is a material, such at titanium, titanium/tungsten, nichrome or aluminum all of which are readily oxidized and their oxide is resistive to the bonding of the solder 23. This circuit configuration thus has the advantage of providing contact between the conductor 11 and the metalization 18 which comprises a circuit that is part of the semiconductor device 100 without fear of the solder due to different temperature coefficients expanding and cracking the semiconductor device 100.

In FIG. 4 a circuit 120 includes a substrate 10 which is a thin film ceramic substrate having components 110 solder to a conductor 2 by soldered 8. The solder 8 is retained by a barrier mask 3 which is manufactured by the processes disclosed herein. A via 14 in the substrate 10 has a metal 4 such as titanium, titanium/tungsten, nichrome or aluminum deposited on its inner walls. The substrate 10 is soldered to a mounting block 21 by solder 23 which is prevented from wicking up the via 14 by the metal 4.

Figure 5A:
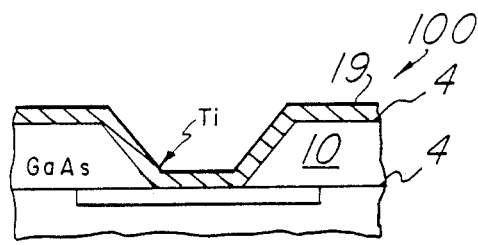
FIGS. 5 a-e and 6 a-g illustrate the steps used to manufacture the semiconductor devices of FIG. 3 and 4.
Figure 5B:
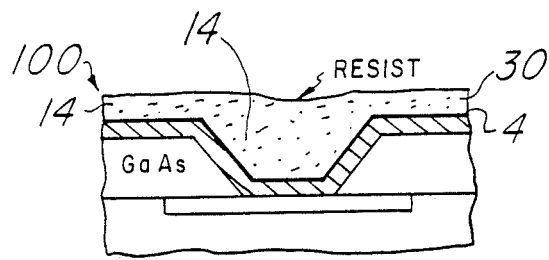

The process by which the embodiments of FIGS. 3 and 4 are manufactured include all standard semiconductor processing steps used in the manufacture of the semiconductor device 100. Referring to FIG. 5a, after the manufacture of the semiconductor device 100 or the circuit 120 is completed, including via formation, a relatively thin layer of titanium 4 or other similar material 19 as discussed above is deposited on the substrate 10 which in the embodiment of FIG. 5 is a gallium arsenide substrate but the disclosed process also includes the steps used to manufacture the the thin film substrate of FIG. 4 either through evaporation or sputtering on the backside of the substrate 10 that the semiconductor device 100 is mounted on. The backside of the substrate 10 is then covered with a photoresist 30 or is spun with a photoresist using conventional techniques. Note that the photoresist fills the via 14. This is illustrated in FIG. 5b. During this process, the photoresist tends to planarize the slice.

Figure 5C:
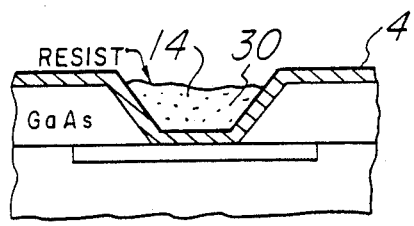
Figure 5D:
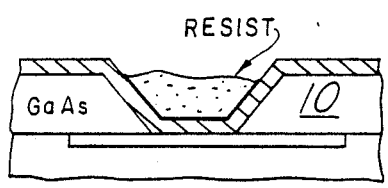
Figure 5E:
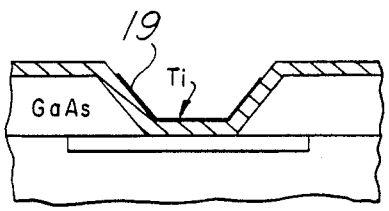

Referring to FIG. 5c, a blanket optical exposure and subsequent development removes the photoresist 4 for the optically activated photoresist 30 from the backside surface of the substrate 10. It should be noted that in this process the resist used is 5 micrometers thick AZ 4620 resist manufactured by Shippley Manufacturing Co. and is exposed for 300 seconds at 4 mW/cm square. This process leaves some resist 30 within the via hole 14. The exposed titanium is then removed by plasma etching or alternate means as is illustrated in 5d.

When titanium is used as the material 4 and plasma etching is in the stripping process, a gas of 95% $CF_4O_2$ and 8% $O_2$ operates effectively. Lastly, the residual resist in a via hole is removed by a solvent or other means, thus leaving the configuration of FIG. 5e which can be readily used in the embodiments of FIGS. 3 and 4.

Figure 6F:
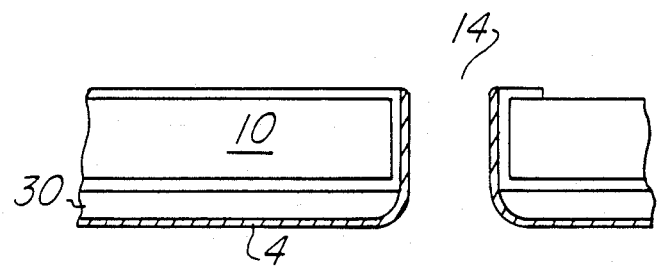
Figure 6G:
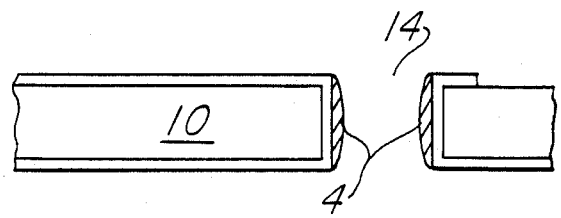
Figure 6A:
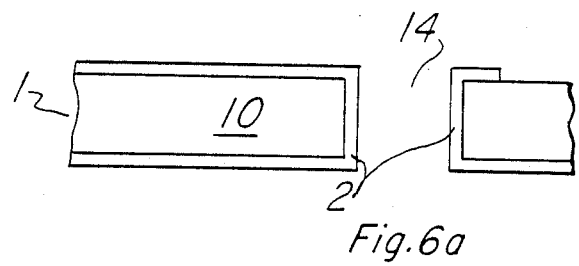
Figure 6B:
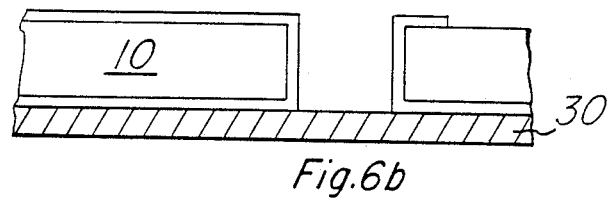
Figure 6C:
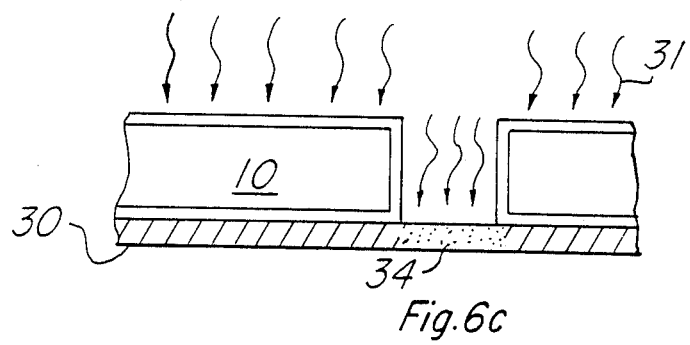

FIGS. 6 illustrates an alternate embodiment of the invention in which the backside of the substrate 10 is covered with a positive dry photoresist 30 (FIG. 6a and 6b). The front side of the substrate 10 is then exposed to ultraviolet light 31 as is illustrated in FIG. 6c. The steps begining with FIG. 6e are then completed.

Figure 6D:
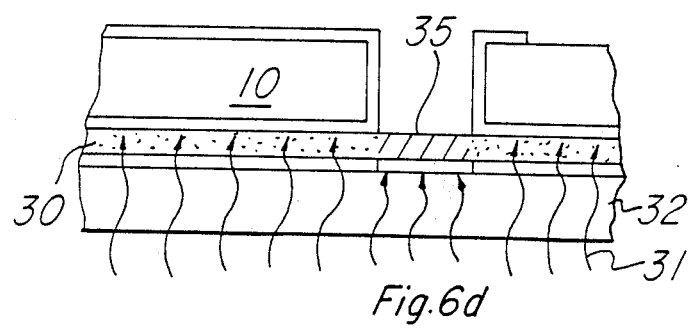
Figure 6E:
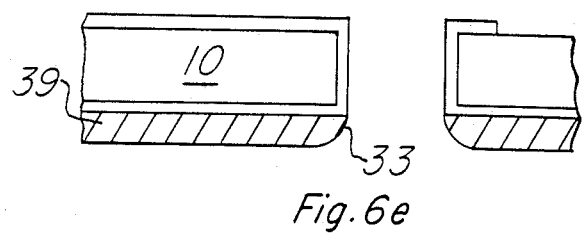

In FIG. 6d a second embodiment of the alternate method includes a negative photoresist 39 applied to the backside of the substrate 10. A phototool 32 is aligned over the via 14 and ultraviolet light 31 is used to expose the backside of the substrate 10. The photoresist 35 over the via 14 is removed by the film development process and the substrate 10 and photoresist 39 are baked in an oven to round the corners 33 of the photoresist at the via as is illustrated in FIG. 6e.

In FIG. 6f one of the above referenced materials 1a is deposited over the photoresist 39 and in the via 14. Finally the photoresist 30/39 is removed with the appropriate lift off chemical process leaving the via walls covered with a material 4 that the solder 23 will not adhere to (FIGS. 6f and 6g).

Accordingly, we claim:

1. A method of preparing a first circuit structure having at least a single via for soldering to a second structure comprising the steps of:
   depositing a first material that is resistive to solder bonding on a first surface and on a wall portion of the via of the first structure;
   removing the first material from the first surface; and
   preventing the removal of the first material from the wall portion of the via.

2. The method according to claim 1 wherein the steps of removing the first material from the first surface and preventing the removal of the first material from the wall portion of the via are accomplished by:
   covering the first material with a photo sensitive material;
   exposing the photo sensitive material to light having a predetermined intensity for a preselected period of time so that unexposed photo sensitive material remains within the via;
   removing the exposed photo sensitive material;
   removing the uncovered first material; and
   removing unexposed photo sensitive material from within the via.

3. The method according to claim 2 wherein the step of removing the uncovered first material comprises the step of:
   plasma etching the first structure.

4. The method according to claim 3 further comprising the step of soldering the first structure to the second structure.

5. The method according to claim 4 wherein the step of soldering the first structure to the second structure comprises the steps of:
   placing a layer of solder between the first and second structures and heating the combination of the first structure, solder and second structure.

6. The method according to claim 1 wherein the step of depositing the first material on the first surface and a wall portion of the via comprises the steps of:
   covering the first surface and a portion of the via along the first surface with a photosensitive material;
   covering the photosensitive material over the via with a phototool;
   exposing the photosensitive material to light having a predetermined wavelength;
   removing the phototool and photosensitive material from over the via; and
   depositing the first material over the photosensitive material and on the walls of the via.

7. The method according to claim 6 wherein the steps of removing the first material from the first surface and preventing the removal of the first material from the via wall portion are accomplished by removing the remaining photosensitive material from the first surface.

8. The method according to claim 6 further comprising the step of soldering the first structure to the second structure.

9. The method according to claim 8 wherein the first circuit structure is a semiconductor device and the step of soldering the semiconductor device to the second structure comprises the steps of:
 placing a layer of solder between the first and second structures and heating the combination of the first structure, solder and second structure.

10. The method of claim 6 wherein the first material is removed from the first surface by a lift off chemical process.

11. The method according to claim 1 wherein the first circuit structure comprises a gallium arsenide substrate.

12. The method according to claim 1 wherein the second structure is a mounting block.

13. The method according to claim 1 wherein the first structure comprises a thin film ceramic substrate.

14. The method of claim 1 wherein the first material is chosen from the group consisting of titanium, titanium/tungsten, nichrome and aluminum.

15. The method according to claim 1 wherein the step of depositing the first material on the first surface and on the via wall portion is accomplished by:
 covering the first surface and the via with a photosensitive material;
 exposing a second surface of the first structure with light of a preselected wavelength so that a portion of the light penetrates the via to impinge on photosensitive material;
 removing photosensitive material which has been exposed to light passing through the via; and
 depositing the first material over the photosensitive material and along the via wall portion.

16. The method of claim 15 wherein the step of exposing the second surface is performed with ultraviolet light.

* * * * *